(12) United States Patent
Hsiung et al.

(10) Patent No.: US 11,587,799 B2
(45) Date of Patent: Feb. 21, 2023

(54) METHODS AND APPARATUS FOR PROCESSING A SUBSTRATE (71) Applicant: APPLIED MATERIALS, INC., Santa Clara, CA (US)

(72) Inventors: Chien-Kang Hsiung, Taipei (TW); Yuichi Wada, Chiba (JP); Glen T. Mori, Gilroy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 290 days.

(21) Appl. No.: 16/939,652

(22) Filed: Jul. 27, 2020

(65) Prior Publication Data

US 2021/0166953 A1 Jun. 3, 2021

Related U.S. Application Data (60) Provisional application No. 62/942,261, filed on Dec. 2, 2019.

(51) Int. Cl.
H01L 21/48 (2006.01)
H01L 23/367 (2006.01)

(52) U.S. Cl.
CPC ........ *H01L 21/4882* (2013.01); *H01L 23/367* (2013.01)

(58) Field of Classification Search
None
See application file for complete search history.

(56) References Cited

U.S. PATENT DOCUMENTS

| 9,972,960 | B1 | 5/2018 | Koontz et al. |
| 2011/0126893 | A1 | 6/2011 | Myong |
| 2016/0035660 | A1 | 2/2016 | Terasaki et al. |
| 2016/0189995 | A1 | 6/2016 | Gondcharton et al. |
| 2017/0025381 | A1 | 1/2017 | Tsai et al. |
| 2017/0110298 | A1 | 4/2017 | Ricci et al. |
| 2018/0082976 | A1 | 3/2018 | Edelstein et al. |
| 2021/0166953 | A1* | 6/2021 | Hsiung ............... H01L 21/4882 |

FOREIGN PATENT DOCUMENTS

| CN | 1755921 A | 4/2006 |
| CN | 101699748 A | 4/2010 |
| CN | 103646972 A | 3/2014 |
| GB | 2470802 A | 12/2010 |
| JP | 2015128103 A | 7/2015 |
| WO | WO 2012/028691 A1 | 3/2012 |

OTHER PUBLICATIONS

International Search Report for PCT/US2020/057283, dated Feb. 15, 2021.

* cited by examiner

Primary Examiner — Jack S Chen
(74) Attorney, Agent, or Firm — Moser Taboada (57) ABSTRACT Methods and apparatus for processing a substrate are provided herein. For example, the method can include depositing a first layer of metal on a first substrate; depositing a second layer of metal atop the first layer of metal; depositing a third layer of metal on a second substrate; depositing a fourth layer of metal atop the third layer of metal; and bringing the second layer of material into contact with the fourth layer of material under conditions sufficient to cause the first substrate to be bonded to the second substrate by a diffusion layer formed by portions of the first layer of metal diffusing through the second layer of metal and portions of the third layer of metal diffusing through the fourth layer of metal.

8 Claims, 6 Drawing Sheets

METHODS AND APPARATUS FOR PROCESSING A SUBSTRATE

CROSS REFERENCE TO RELATED APPLICATIONS

This application claims the benefit of and priority to U.S. Provisional Patent Application Ser. No. 62/942,261, which was filed on Dec. 2, 2019, the entire contents of which is incorporated herein by reference.

FIELD

Embodiments of the present disclosure generally relate to a method and apparatus for processing a substrate, and more particularly, to methods and apparatus for high performance chip scale thermal conductance interface formation.

BACKGROUND

Methods and apparatus for connecting cooling systems to a chip (integrated chip (IC)), such as high-power chips, system on chips (SoC), or chiplets are known. For example, during package level assembly of a chip, several layers of one or more suitable thermal interface materials (TIM), such as solder or indium based materials, thermal spreaders, cooling plates (heat sink), and/or spacers (metal) can be used to conduct heat from the chip to a cooling system. Conventional cooling systems can include, for example, remote cooling chips, such as thermal electrical cooling ICs or microelectromechanical systems (MEMS) microfluid canals to improve thermal dissipation capability.

The inventors have found, however, that methods and apparatus for high performance chip scale thermal conductance interface formation during substrate (wafer) assembly may improve thermal conductivity from a chip to a cooling system.

SUMMARY

Methods and apparatus for processing a substrate are provided herein. In some embodiments, the method can include depositing a first layer of metal on a first substrate; depositing a second layer of metal atop the first layer of metal; depositing a third layer of metal on a second substrate; depositing a fourth layer of metal atop the third layer of metal; and bringing the second layer of metal into contact with the fourth layer of metal under conditions sufficient to cause the first substrate to be bonded to the second substrate by a diffusion layer formed by portions of the first layer of metal diffusing through the second layer of metal and portions of the third layer of metal diffusing through the fourth layer of metal.

In accordance with at least some embodiments, there is provided a non-transitory computer readable storage medium having stored thereon instructions that when executed by a processor perform a method for processing a substrate including depositing a first layer of metal on a first substrate; depositing a second layer of metal atop the first layer of metal; depositing a third layer of metal on a second substrate; depositing a fourth layer of metal atop the third layer of metal; and bringing the second layer of metal into contact with the fourth layer of metal under conditions sufficient to cause the first substrate to be bonded to the second substrate by a diffusion layer formed by portions of the first layer of metal diffusing through the second layer of metal and portions of the third layer of metal diffusing through the fourth layer of metal.

In accordance with at least some embodiments, there is provided an integrated circuit having a first layer of metal disposed thereon; a second layer of metal, different than the first layer of metal, disposed on the first layer of metal; a substrate having a third layer of metal disposed thereon; a fourth layer of metal, different than the third layer of metal, disposed on the third layer of material; and an interlayer comprising a portion of the first layer of metal and a portion of the third layer of metal disposed between the second layer of metal and the fourth layer of metal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus for processing a substrate are provided herein. For example, the methods described herein can be used for high performance chip scale thermal conductance interface formation. More particularly, two substrates, e.g., cooling module substrate to a chiplet and/or a system on chip (SoC), can be bonded using, for example, one or more suitable metals, e.g., copper, to form an interlayer of metal. The copper can be covered by, for example, one or more suitable passivation metals. The copper atoms penetrate the passivation metal under bonding conditions described herein to form the copper interlayer to bond the two substrates. Using the bonding methods described herein can provide about ten times (or more) of thermal conductance when compared to conventional bonding methods that use one or more thermal interface materials (TIM), can significantly reduce theta Jc (junction-to-case resistance), can have a relatively small footprint, can have very thin bond line thickness (BLT), and can be performed at relatively low temperatures, e.g., <250 C., at relatively low pressure, e.g., (~0.1 kg/cm2), and in a relatively short time (~5 min).

Figure 1:
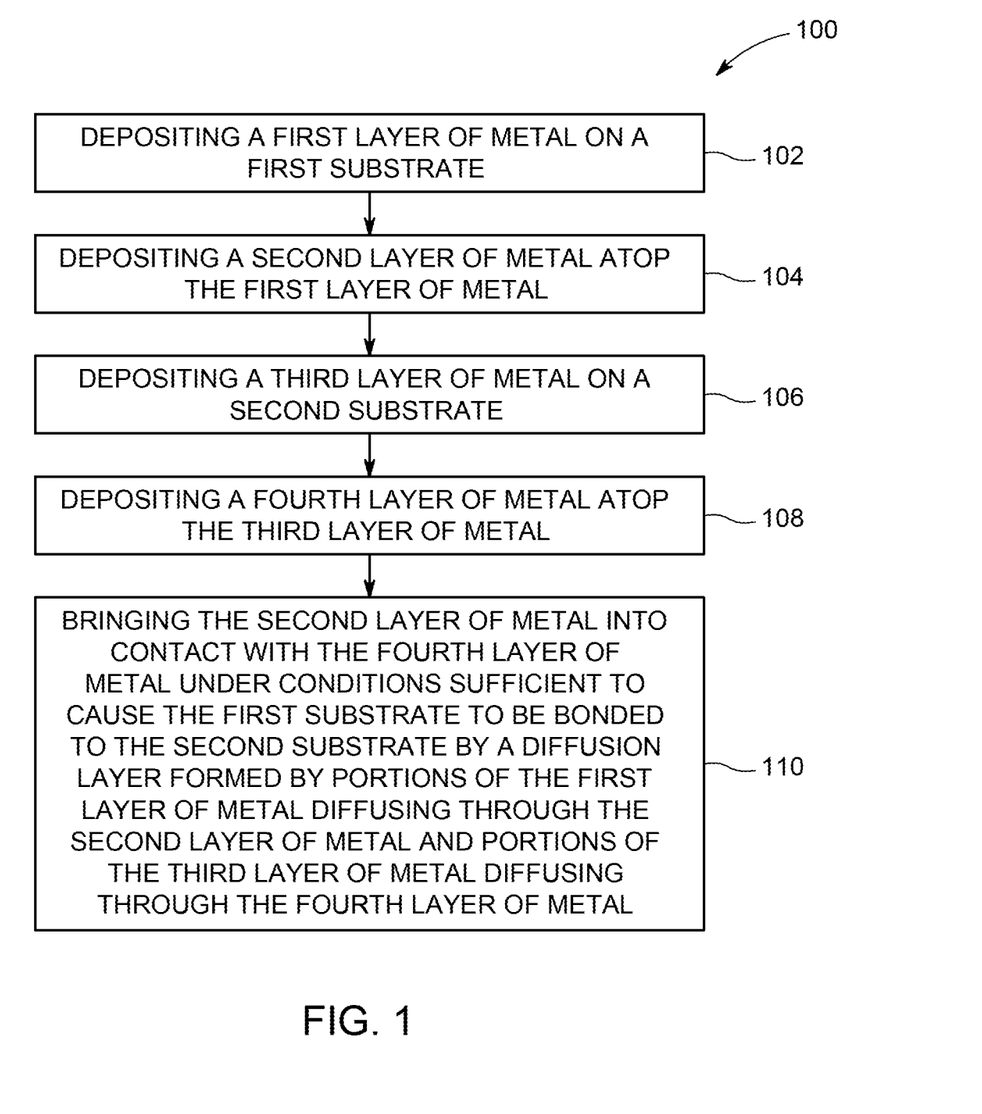
FIG. 1 is a flowchart of a method for processing a substrate, in accordance with at least some embodiments of the present disclosure.
Figure 2:
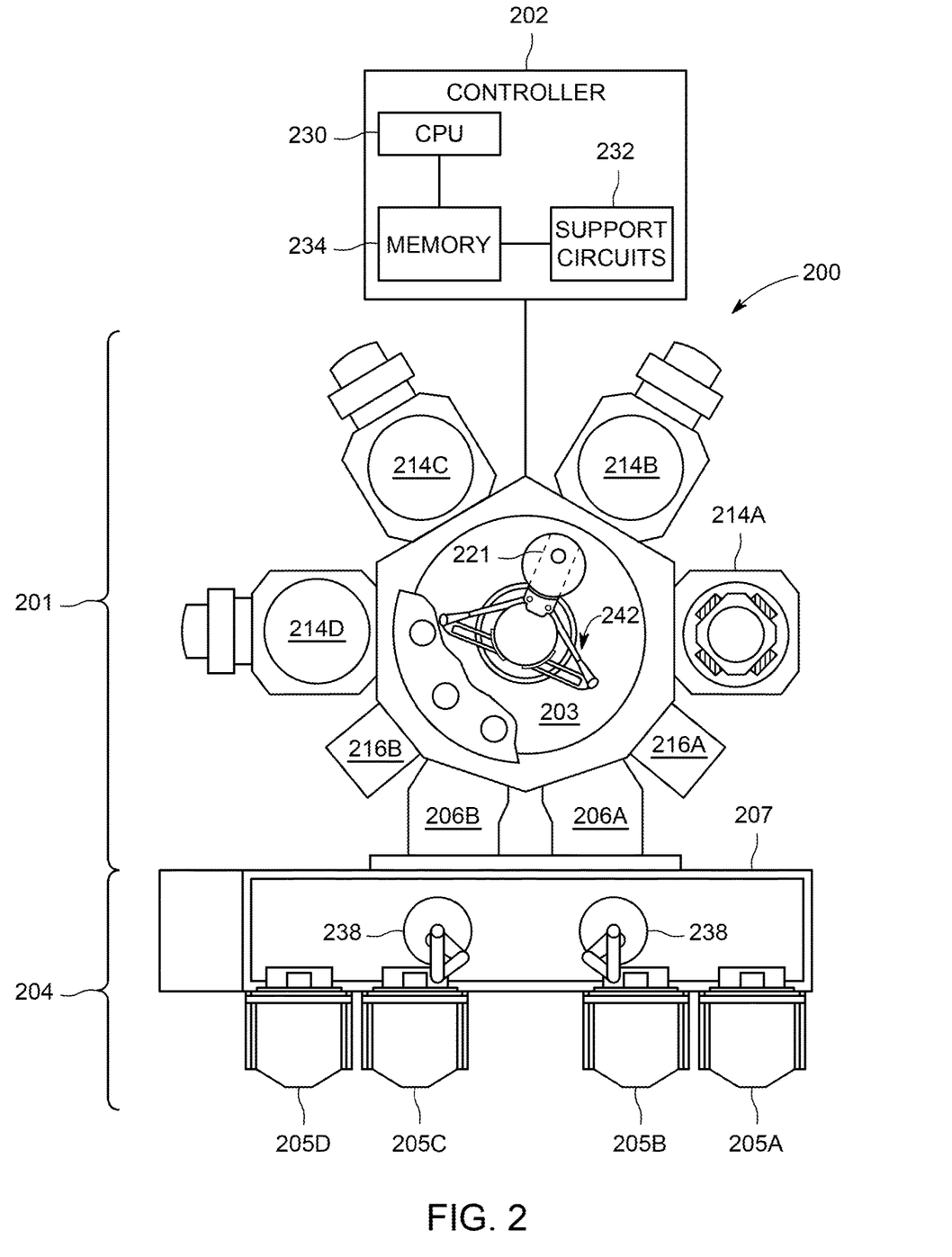
FIG. 2 is a schematic diagram of an apparatus for processing a substrate, in accordance with at least some embodiments of the present disclosure.

FIG. 1 is a flowchart of a method 100 for processing a substrate, and FIG. 2 is a tool 200 (or apparatus) that can used for carrying out the method 100, in accordance with at least some embodiments of the present disclosure.

The method 100 may be performed in an tool 200 including any suitable process chambers configured for one or more of physical vapor deposition (PVD), chemical vapor deposition (CVD) and/or atomic layer deposition (ALD), such as plasma enhanced ALD or thermal ALD (e.g., no plasma formation). Exemplary processing systems that may be used to perform the inventive methods disclosed herein may include, but are not limited to, those of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including those from other manufacturers, may also be suitably used in connection with the teachings provided herein.

The tool 200 can be embodied in individual process chambers that may be provided in a standalone configuration or as part of a cluster tool, for example, an integrated tool (hereinafter tool 200) described below with respect to FIG. 2. Examples of the integrated tool include the CENTURA® and ENDURA® and PRODUCER® line of integrated tools, available from Applied Materials, Inc., of Santa Clara, Calif. The methods described herein may be practiced using other cluster tools having suitable process chambers coupled thereto, or in other suitable process chambers. For example, in some embodiments, the inventive methods discussed above may be performed in an integrated tool such that there are limited or no vacuum breaks between processing steps. For example, reduced vacuum breaks may limit or prevent contamination (e.g., oxidation) of the tungsten liner layer or other portions of the substrate.

The integrated tool includes a vacuum-tight processing platform (processing platform 201), a factory interface 204, and a system controller 202. The processing platform 201 comprises multiple process chambers, such as 214A, 214B, 214C, and 214D operatively coupled to a vacuum substrate transfer chamber (transfer chamber 203). The factory interface 204 is operatively coupled to the transfer chamber 203 by one or more load lock chambers (two load lock chambers, such as 206A and 206B shown in FIG. 2).

In some embodiments, the factory interface 204 comprises at least one docking station 207, at least one factory interface robot 238 to facilitate the transfer of one or more semiconductor substrates (wafers). The docking station 207 is configured to accept one or more front opening unified pod (FOUP). Four FOUPS, such as 205A, 205B, 205C, and 205D are shown in the embodiment of FIG. 2. The factory interface robot 238 is configured to transfer the substrates from the factory interface 204 to the processing platform 201 through the load lock chambers, such as 206A and 206B. Each of the load lock chambers 206A and 206B have a first port coupled to the factory interface 204 and a second port coupled to the transfer chamber 203. The load lock chamber 206A and 206B are coupled to a pressure control system (not shown) which pumps down and vents the load lock chambers 206A and 206B to facilitate passing the substrates between the vacuum environment of the transfer chamber 203 and the substantially ambient (e.g., atmospheric) environment of the factory interface 204. The transfer chamber 203 has a vacuum robot 242 disposed within the transfer chamber 203. The vacuum robot 242 is capable of transferring substrates 221 between the load lock chamber 206A and 206B and the process chambers 214A, 214B, 214C, and 214D.

In some embodiments, the process chambers 214A, 214B, 214C, and 214D, are coupled to the transfer chamber 203. The process chambers 214A, 214B, 214C, and 214D comprise at least an ALD chamber, a CVD chamber, a PVD chamber, an e-beam deposition chamber, and/or an electroplating, electroless (EEP) deposition chamber.

In some embodiments, one or more optional service chambers (shown as 216A and 216B) may be coupled to the transfer chamber 203. The service chambers 216A and 216B may be configured to perform other substrate processes, such as degassing, bonding, chemical mechanical polishing (CMP), wafer cleaving, etching, plasma dicing, orientation, substrate metrology, cool down and the like.

The system controller 202 controls the operation of the tool 200 using a direct control of the process chambers 214A, 214B, 214C, and 214D or alternatively, by controlling the computers (or controllers) associated with the process chambers 214A, 214B, 214C, and 214D and the tool 200. In operation, the system controller 202 enables data collection and feedback from the respective chambers and systems to optimize performance of the tool 200. The system controller 202 generally includes a central processing unit (CPU) 230, a memory 234, and a support circuit 232. The CPU 230 may be any form of a general-purpose computer processor that can be used in an industrial setting. The support circuit 232 is conventionally coupled to the CPU 230 and may comprise a cache, clock circuits, input/output subsystems, power supplies, and the like. Software routines, such as processing methods as described above may be stored in the memory 234 (e.g., non-transitory computer readable storage medium) and, when executed by the CPU 230, transform the CPU 230 into a specific purpose computer (system controller 202). The software routines may also be stored and/or executed by a second controller (not shown) that is located remotely from the tool 200.

Figure 3A:
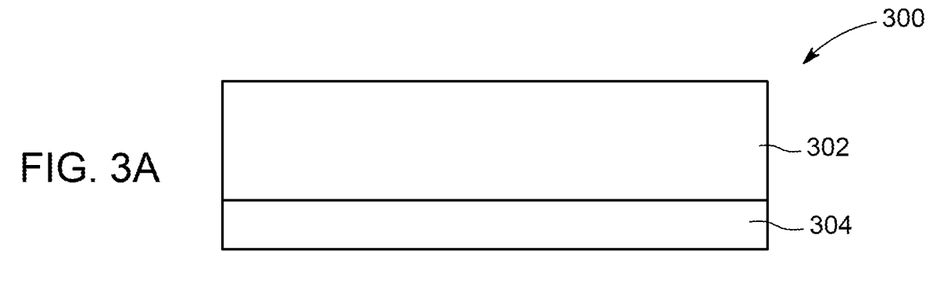
FIGS. 3A-3C are diagrams illustrating a processing sequence of the method of FIG. 1, in accordance with at least some embodiments of the present disclosure.

Continuing with reference to FIG. 1, initially one or more substrates, thermal modular assembly, or the like may be loaded into one or more of the Four FOUPS, such as 205A, 205B, 205C, and 205D (FIG. 3A). For example, in at least some embodiments, a cooling module substrate 300 (wafer) can be loaded into FOUP 205A. The substrate 300 can include a layer 302 on which a chip scale cooling system 304 (or thermoelectric cooling module) can be disposed. The layer 302 can be made from one or more materials suitable for disposing the chip scale cooling system 304 on. For example, in at least some embodiments, the layer 302 can be formed from silicon, glass, or metal substrate made from copper, stainless steel, and/or aluminum.

Once loaded, the factory interface robot 238 can transfer the substrate 300 from the factory interface 204 to the processing platform 201 through, for example, the load lock chamber 206A. The vacuum robot 242 can transfer the substrate 300 from the load lock chamber 206A to and from one or more of the process chambers 214A-214D and/or the service chambers 216A and 216B.

Figure 3B:
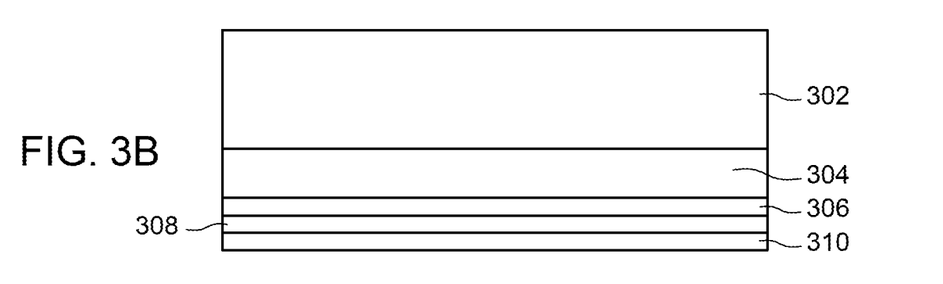

For example, in at least some embodiments, an optional layer of dielectric material (e.g., a dielectric layer 306) can be deposited on the chip scale cooling system 304 (FIG. 3B). The dielectric layer 306 is configured to prevent copper diffusion into the chip scale cooling system 304 (or other adjacent IC layers). The dielectric layer 306 can be deposited using one or more suitable deposition processes, e.g., CVD, ALD, PVD, and/or other suitable deposition process. For example, in at least some embodiments, the dielectric layer 306 can be deposited using CVD and/or ALD. The dielectric layer 306 can be formed using one more suitable dielectric materials including, but not limited to, oxide, silicon oxide, silicon nitride, silicon carbon nitride, or similar dielectric materials. For example, in at least some embodiments, the dielectric layer 306 can be formed using silicon oxide. The dielectric layer 306 can have a thickness of about 0.05 μm to about 1 μm.

Next, at 102, a first layer 308 (FIG. 3B) of one or more suitable metals can be deposited on the substrate 300 (e.g., a first substrate). More particularly, in at least some embodiments, the first layer 308 of metal can be deposited on the dielectric layer 306, when used. Alternatively, in at least some embodiments, the first layer 308 of metal can be deposited directly on the chip scale cooling system 304 (e.g., when the dielectric layer 306 is not used). The one or more suitable metals that can be deposited on the substrate 300 can include, but is not limited to, copper, nickel, and the like. For example, in at least some embodiments, the first layer 308 of metal can be copper. The first layer 308 of metal can be deposited using one or more suitable deposition processes including, but not limited to, PVD, ALD, CVD, electroplating, electroless (EEP) deposition, and/or other suitable deposition process. For example, in at least some embodiments, the first layer 308 of metal can be deposited using PVD, CVD, and/or EEP deposition. The first layer 308 of metal can have a thickness of about 0.05 μm to about 10 μm.

Figure 3C:
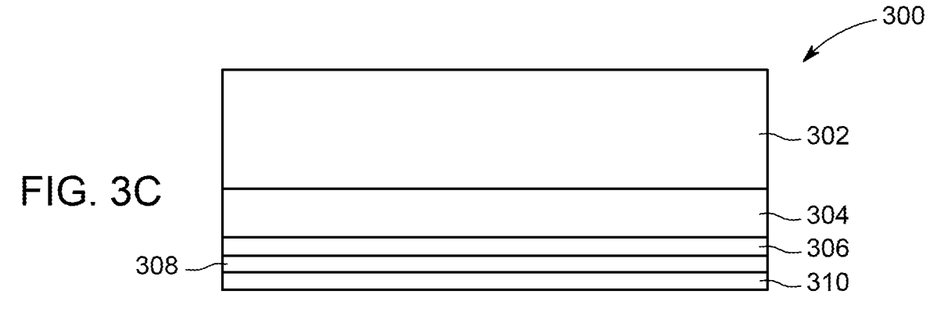

Next, at 104, a second layer 310 of one or more suitable metals can be deposited atop the first layer 308 of metal and can be configured as a passivation layer. The one or more suitable metals can include, but is not limited to, silver, palladium, platinum, gold. and/or other suitable metal. The inventors have found that when such metals are used, conventional TIM materials, such as solder or indium-based materials are not needed, but can be used if desired. For example, in at least some embodiments, the second layer 310 can be formed using palladium. The second layer 310 of metal can be formed using one or more suitable deposition processes including, but not limited to, ALD, PVD, CVD, e-beam deposition, EEP, and/or other suitable deposition process. For example, in at least some embodiments, the passivation layer can be formed using PVD, CVD, e-beam deposition, and/or EEP. The second layer 310 of metal can have a thickness of about 0.001 μm to about 0.05 μm.

Figure 4A:
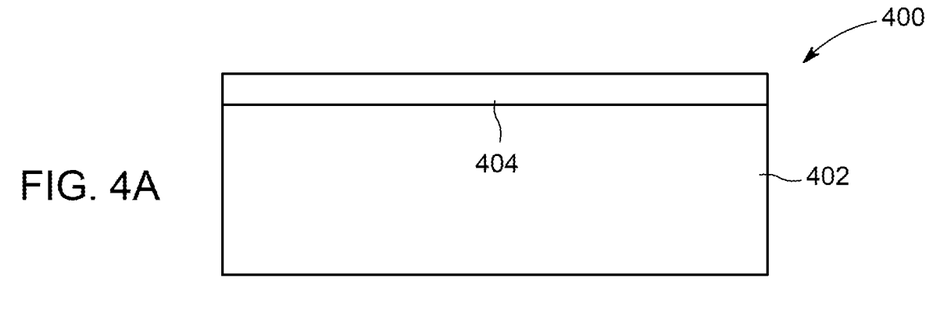
FIGS. 4A-4D are diagrams illustrating a processing sequence of the method of FIG. 1, in accordance with at least some embodiments of the present disclosure.

One or more additional substrates may be loaded into one or more of the Four FOUPS, such as 205A, 205B, 205C, and 205D (FIG. 4A). For example, in at least some embodiments, a substrate 400 (wafer) can be loaded into FOUP 205B. The substrate 400 can include a layer 402 on which a chipset 404 (or SoC or high-powered IC) can be disposed. Similar to the layer 302, the layer 402 can be made from one or more materials suitable for disposing the chipset 404 on. For example, in at least some embodiments, the layer 402 can be formed from silicon.

Once loaded, the factory interface robot 238 can transfer the substrate 400 from the factory interface 204 to the processing platform 201 through, for example, the load lock chamber 206B. The vacuum robot 242 can transfer the substrate 400 from the load lock chamber 206B to and from one or more of the process chambers 214A-214D and/or the service chambers 216A and 216B.

Figure 4B:
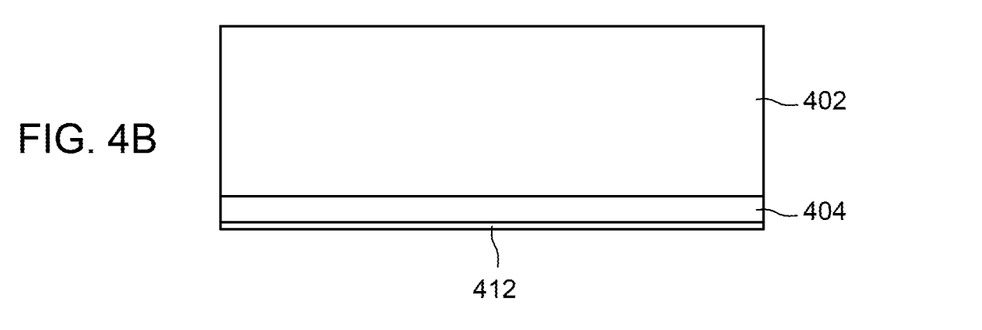

In at least some embodiments, one or more hybrid bonding interfaces 412 such as copper oxide (or other conventional bonding interfaces) are formed on the chipset 404 (FIG. 4B).

Figure 4C:
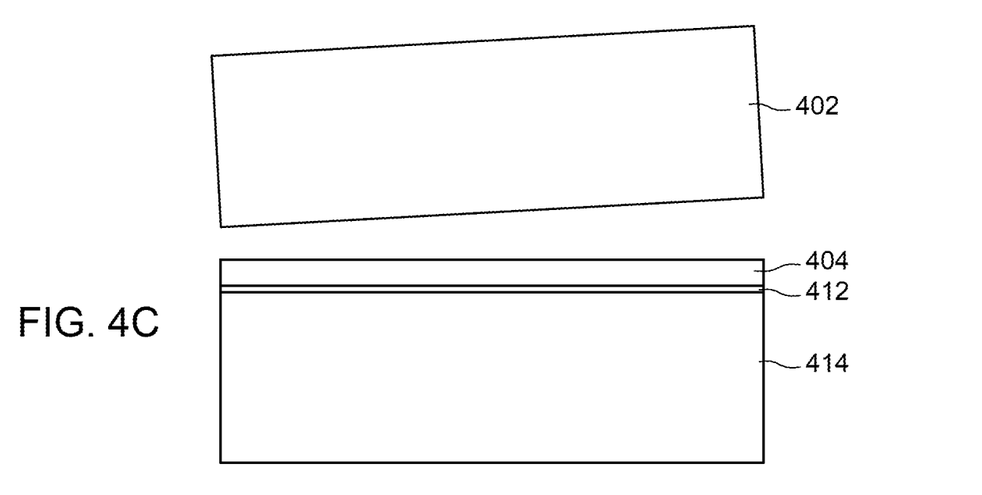

Next, the layer 402 can be removed using one more suitable removal processes (FIG. 4C). Suitable removal processes that can be used to remove the layer 402 can include, but are not limited to, a substrate cleaving process including hydrogen or stealth laser treatment or vector field mapping (VFM), CMP process, or etch process. For example, in at least some embodiments, the substrate 400 can be transferred to the service chamber 216A, which can be configured as an etch chamber and configured to remove the layer 402.

After the layer 402 is removed, a carrier substrate 414 can be deposited on the hybrid bonding interface 412 (FIG. 4C), using, for example, one or more of the process chambers 214A-214D (e.g., PVD, CVD, ALD, and the like). The carrier substrate 414 can be formed using one or more suitable materials configured to protect the chipset 404 while the substrate 400 is being transferred to and from the process chambers 214A-241D and/or the service chambers 216A and 216B for processing. For example, in at least some embodiments, the carrier substrate 414 can be made from silicon with adhesive, passive silicon interposer or functional silicon interposer, glass with adhesive, and the like.

Figure 4D:
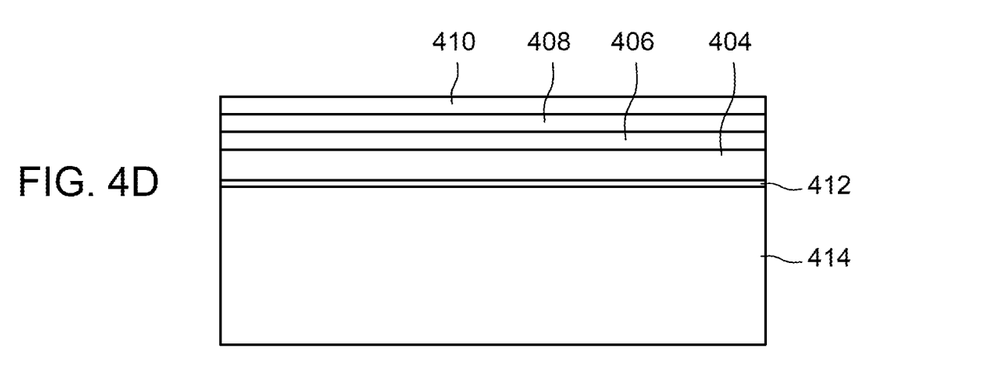

Next, as described above with respect to FIG. 3B, in at least some embodiments, an optional dielectric layer 406 can be deposited on the chipset 404 (FIG. 4D). As noted above, the dielectric layer 406 is configured to prevent copper diffusion into the chipset 404 (or other adjacent IC layers). The dielectric layer 406 can be deposited using one or more suitable deposition processes, e.g., CVD, ALD, PVD, and/or other suitable deposition process. For example, in at least some embodiments, the dielectric layer 406 can be deposited using CVD and/or ALD. The dielectric layer 406 can be formed using one more suitable dielectric materials including, but not limited to, silicon oxide, silicon nitride, or similar dielectric materials. For example, in at least some embodiments, the dielectric layer 406 can be formed using silicon oxide. The dielectric layer 406 can have a thickness of about 0.05 μm to about 1 μm.

Next, in a manner similar to 102, at 106, a third layer 408 of one or more suitable metals can be deposited on the substrate 400 (e.g., a second substrate). More particularly, in at least some embodiments, the third layer 408 of metal can be deposited on the dielectric layer 406, when used. Alternatively, in at least some embodiments, the third layer 408 of metal can be deposited directly on the chipset 404 (e.g., when the dielectric layer 406 is not used). The one or more suitable metals that can be deposited on the substrate 400 can include, but is not limited to, copper, nickel, and the like. For example, in at least some embodiments, the third layer 408 of metal can be copper. The third layer 408 of metal can be deposited using one or more suitable deposition processes including, but not limited to, PVD, ALD, CVD, electroplating, electroless (EEP) deposition, and/or other suitable deposition process. For example, in at least some embodiments, the third layer 408 of metal can be deposited using PVD, CVD, and/or EEP deposition. The third layer 408 of metal can have a thickness of about 0.05 μm to about 10 μm.

Next, at 108, a fourth layer 410 of one or more suitable metals can be deposited atop the third layer 408 of metal and can be configured as a passivation layer. The one or more suitable metals can include, but is not limited to, silver, palladium, platinum, gold. and/or other suitable metal. As noted above, the inventors have found that when such metals are used, conventional TIM materials, such as solder or indium-based materials are not needed, but can be used if desired. For example, in at least some embodiments, the fourth layer 410 can be formed using palladium. The fourth layer 410 of metal can be formed using one or more suitable deposition processes including, but not limited to, ALD, PVD, CVD, e-beam deposition, EEP, and/or other suitable deposition process. For example, in at least some embodiments, the passivation layer can be formed using PVD, CVD, e-beam deposition, and/or EEP. The fourth layer 410 of metal can have a thickness of about 0.001 µm to about 0.05 µm.

Figure 5A:
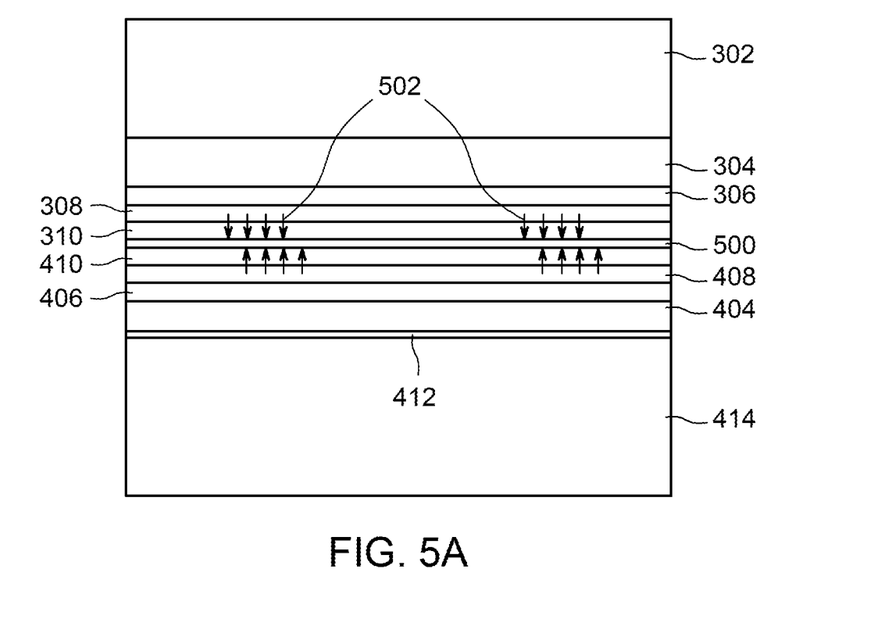
FIGS. 5A-5C are diagrams illustrating a processing sequence of the method of FIG. 1, in accordance with at least some embodiments of the present disclosure.

Next, at 110, the second layer 310 of metal (e.g., second layer of metal) is brought into contact with the fourth layer 410 of metal (e.g., fourth layer of metal) under conditions sufficient to cause the substrate 300 (e.g., first substrate) to be bonded to the substrate 400 (e.g., second substrate) by a diffusion layer 500 (FIG. 5A). More particularly, the diffusion layer 500 is formed by portions of the first layer 308 of metal diffusing (shown by directional arrows 502) through the second layer 310 of metal and portions of the third layer 408 of metal diffusing through the fourth layer 410 of metal. Thermal compression bonding, fusion bonding, and/or a post annealing process are suitable processes for causing the portions of the first layer 308 of metal to diffuse through the second layer 310 of metal and portions of the third layer 408 of metal to diffuse through the fourth layer 410, thus bonding the substrate 300 to the substrate 400.

In at least some embodiments, the substrate 300 and the substrate 400 can be transferred to one or more of the process chambers 214A-241D and/or one or more of the service chambers 216A and/or 216B. For example, in at least some embodiments the service chamber 216B can be configured for bonding substrates to each other. Alternatively or additionally, the substrates 300 and the substrate 400 can be transferred from the tool 200 and transported to another process chamber or process chambers that are configured to bond the substrate 300 to the substrate 400.

The inventors have found that using the aforementioned metals for the first layer 308 of metal and the second layer 310 of metal (e.g., copper or nickel for the diffusion metal) and the third layer 408 of metal and the fourth layer 410 of metal (e.g., palladium for the passivation metal) allows the bonding of the substrate 300 and the substrate 400 to be carried out at relatively low temperatures, relatively low pressure, and in a relatively short time. For example, in at least some embodiments (e.g., first layer and third layer of metal are copper and second layer and fourth layer of metal are one of silver, palladium, platinum, gold), the temperature at which the substrate 300 and the substrate 400 can be bonded to each other can be about 250° C. Similarly, in such embodiments, the pressure at which the substrate 300 and the substrate 400 can be bonded to each other can be about 0.1 kg/cm². Likewise, in such embodiments, the time required to bond the substrate 300 and the substrate 400 to each other can be about 1 minute to about 30 minutes. For example, in some embodiments, the time required to bond the substrate 300 to the substrate 400 can be about 5 minutes.

Figure 5B:
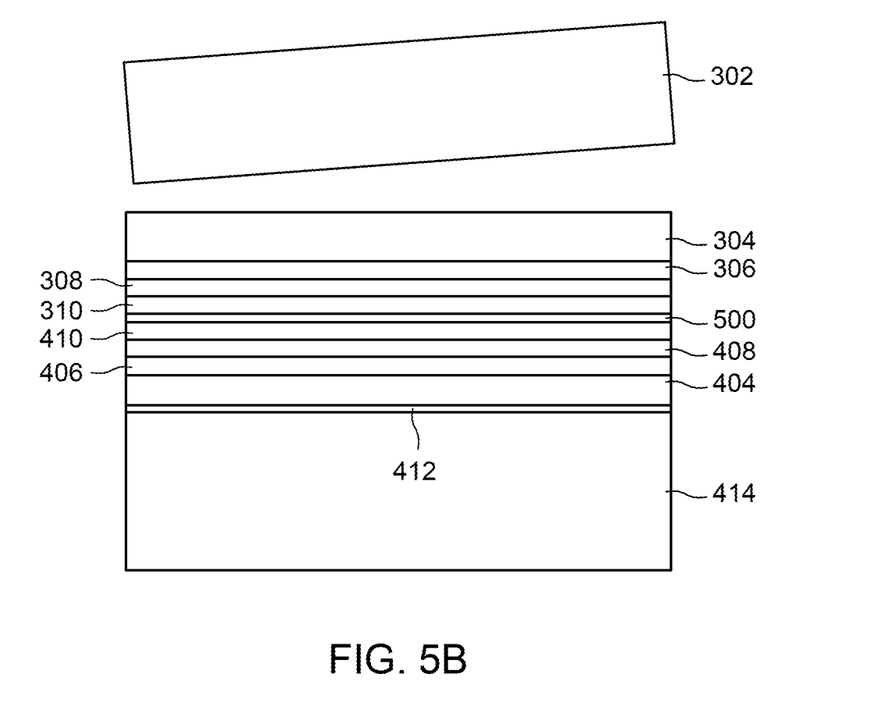
Figure 5C:
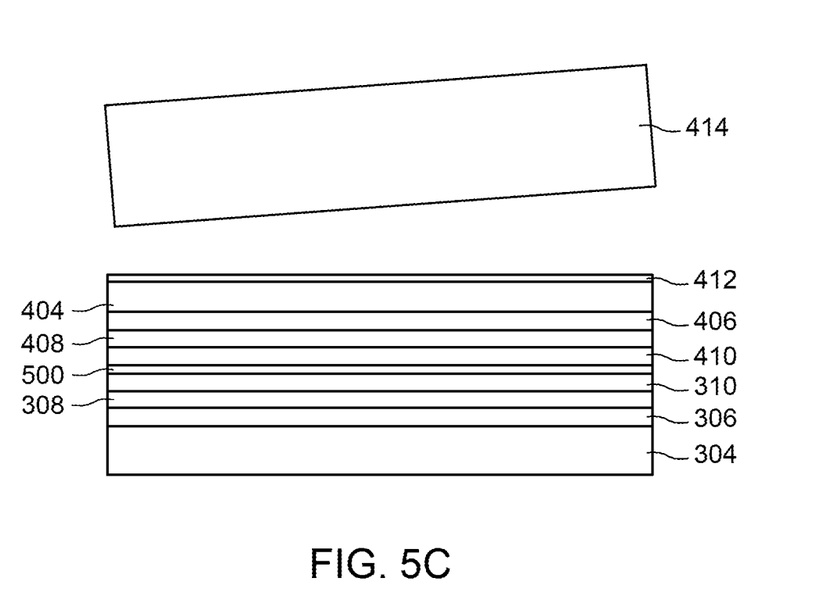

Next, in at least some embodiments, the layer 302 can be removed using, for example, one of substrate cleaving process including hydrogen or stealth laser treatment or VFM, CMP process, or etch process (FIG. 5B). For example, in at least some embodiments, the layer 302 can be transferred to the service chamber 216A, which can be configured as an etch chamber and configured to remove the layer 302. Moreover, the carrier substrate 414 can be removed using one or more suitable removal processes (FIG. 5C). For example, in at least some embodiments, the carrier substrate 414 can be removed using laser and blade dicing and/or plasma dicing.

Figure 6:
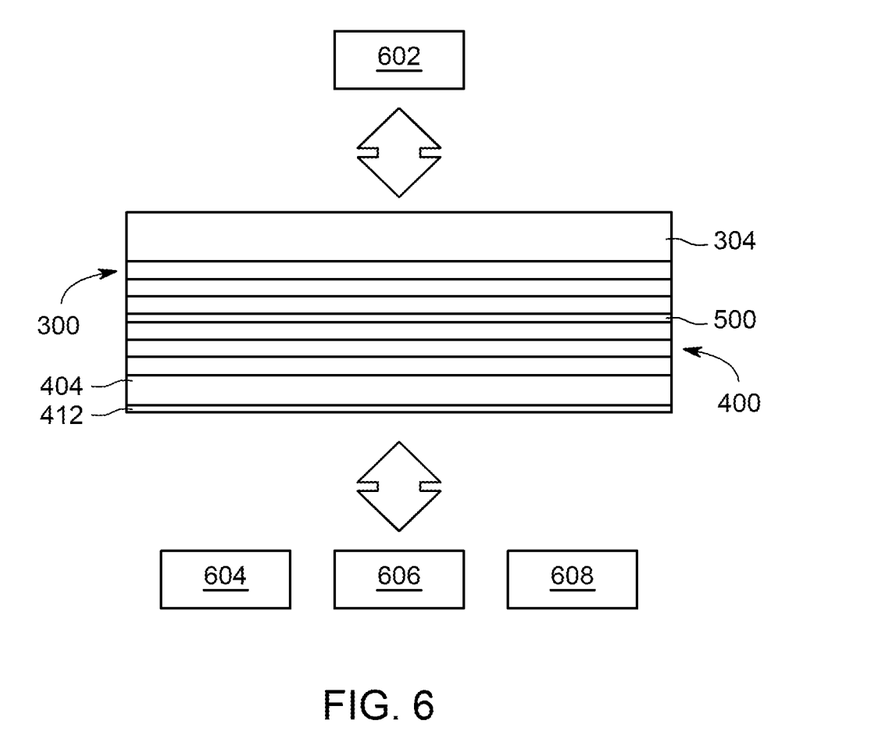
FIG. 6 is a diagram of a substrate, in accordance with at least some embodiments of the present disclosure.

After the layer 302 and the carrier substrate 414 are removed from the substrate 300 and the substrate 400, respectively, the chip scale cooling system 304 and the chipset 404, via the hybrid bonding interfaces 412, can be connected to one or more other modules (FIG. 6). For example, in at least some embodiments, the chip scale cooling system 304 of the substrate 300 can be connected to one or more suitable cooling systems 602. For example, the chip scale cooling system 304 can be connected to a MEMS including one or more of an air-cooled exchangers. Such devices can include piezo stack actuators, synthetic jets, agitators, heat sinks (e.g., fins), heat spreaders, and the like. Likewise, the hybrid bonding interfaces 412 to which the chipset 404 connects can be connected to an interposer 604, another cooling system 606, a power delivery system 608, and the like.

While the foregoing is directed to embodiments of the present disclosure, other and further embodiments of the disclosure may be devised without departing from the basic scope thereof.

The invention claimed is:

1. A method for processing a substrate comprising:
   depositing a first layer of metal on a first substrate;
   depositing a second layer of metal atop the first layer of metal;
   depositing a third layer of metal on a second substrate;
   depositing a fourth layer of metal atop the third layer of metal; and
   bringing the second layer of metal into contact with the fourth layer of metal under conditions sufficient to cause the first substrate to be bonded to the second substrate by a diffusion layer formed by portions of the first layer of metal diffusing through the second layer of metal and portions of the third layer of metal diffusing through the fourth layer of metal.

2. The method of claim 1, further comprising, prior to depositing the first layer of metal on the first substrate and the third layer of metal on the second substrate, depositing, on the first substrate and the second substrate, a layer of dielectric material including at least one of silicon oxide, silicon nitride, or silicon carbon nitride.

3. The method of claim 2, wherein depositing the layer of dielectric material is performed using one of chemical vapor deposition or atomic layer deposition.

4. The method of claim 1, wherein depositing the first layer of metal, the second layer of metal, the third layer of metal, and the fourth layer of metal is performed using one of physical vapor deposition, chemical vapor deposition, e-beam deposition, or electroplating, electroless deposition.

5. The method of claim 1, further comprising:
   wherein the first layer of metal and the third layer of metal are at least one of copper or nickel; and
   wherein the second layer of metal and the fourth layer of metal are at least one of silver, palladium, platinum, or gold.

6. The method of claim 1, wherein the first substrate and the second substrate are made from at least one of silicon, glass, copper, stainless steel, or aluminum.

7. The method of claim 1, wherein the first substrate comprises a cooling module on which the first layer of metal is deposited, wherein the second substrate comprises at least one of an integrated chip or system on chip on which the third layer of metal is deposited, and wherein the method further comprises:

transferring the at least one of the integrated chip or system on chip to a carrier substrate from the second substrate prior to depositing the third layer of metal on the second substrate; and after bonding the first substrate to the second substrate, removing the first substrate from the cooling module and the carrier substrate from the at least one of the integrated chip or system on chip.

8. The method of claim 7, wherein removing the first substrate from the cooling module and removing the second substrate from the at least one of the integrated chip or system on chip is performed using at least one of hydrogen or stealth laser treatment, vector field mapping (VFM) substrate cleaving, chemical mechanical polishing, or etching, and wherein removing the carrier substrate from the at least one of the integrated chip or system on chip is performed using at least one of laser and blade dicing or plasma dicing.

* * * * *